United States Patent
Song et al.

(10) Patent No.: US 11,205,634 B2
(45) Date of Patent: Dec. 21, 2021

(54) BONDING APPARATUS WITH REPLACEABLE BONDING TOOL

(71) Applicant: ASM Technology Singapore Pte Ltd, Singapore (SG)

(72) Inventors: Keng Yew Song, Singapore (SG); Yue Zhang, Singapore (SG); Xiao Liang Chen, Singapore (SG)

(73) Assignee: ASM TECHNOLOGY SINGAPORE PTE LTD, Singapore (SG)

(*) Notice: Subject to any disclaimer, the term of this patent is extended or adjusted under 35 U.S.C. 154(b) by 556 days.

(21) Appl. No.: 16/035,846

(22) Filed: Jul. 16, 2018

(65) Prior Publication Data

US 2020/0020661 A1   Jan. 16, 2020

(51) Int. Cl.
*B23K 3/00* (2006.01)
*H01L 23/00* (2006.01)
(Continued)

(52) U.S. Cl.
CPC ............ *H01L 24/78* (2013.01); *B23K 3/063* (2013.01); *B23K 20/005* (2013.01); *B23K 2101/32* (2018.08); *H01L 2224/78611* (2013.01)

(58) Field of Classification Search
CPC ....... H01L 2924/00; H01L 2224/85205; H01L 2224/78301; H01L 24/78; H01L 2224/78; H01L 2224/78822; B23K 20/005; B23K 20/004; B23K 20/106; B23K 2101/40; B23K 20/10; B23K 11/3072; B23K 20/007; B23K 2101/36; B23K 11/11; B23K 11/115; B23K 11/30; B23K 11/3054; B23K 11/3063; B23K 11/318; B23K 1/0016; B23K 1/06; B23K 20/1225; B23K 20/123; B23K 20/1245; B23K 20/125; B23K 20/126; B23K 20/26; B23K 2101/32;
(Continued)

(56) References Cited

U.S. PATENT DOCUMENTS 5,699,951 A    12/1997  Miyoshi ................... 228/4.5
7,211,033 B2 *  5/2007  Prust .................. B23Q 3/15553
                                                483/10
(Continued)

FOREIGN PATENT DOCUMENTS

JP       H08-186146        7/1996
KR    20130051866 A  *  5/2013  ............ H01L 24/78
(Continued)

OTHER PUBLICATIONS

KR-20130051866-A computer translation (Year: 2021).*
(Continued)

*Primary Examiner* — Erin B Saad
(74) *Attorney, Agent, or Firm* — Ostrolenk Faber LLP (57) ABSTRACT

A bonding apparatus has a bonding tool for bonding a wire to a bonding surface, a bonding tool retainer configured to releasably retain the bonding tool, a bonding tool holder configured to hold at least one bonding tool, a bonding tool manipulator configured to transfer said bonding tool between said bonding tool holder and said bonding tool retainer, and a bonding tool guide configured to guide said bonding tool to be received by said bonding tool retainer during transfer by said bonding tool manipulator.

18 Claims, 3 Drawing Sheets

(51) Int. Cl.
    *B23K 20/00*      (2006.01)
    *B23K 3/06*      (2006.01)
    *B23K 101/32*      (2006.01)

(58) Field of Classification Search
    CPC .. B23K 2201/40; B23K 31/125; B23K 37/02;
                   B23K 37/04; B23K 3/02; B23K 3/04;
                            B23K 3/0638; B23K 3/08
    See application file for complete search history.

(56) References Cited

U.S. PATENT DOCUMENTS

| | | | |
|---|---|---|---|
| 8,672,210 B2 | 3/2014 | Kim | |
| 2017/0229419 A1* | 8/2017 | Hashim | ................ B23K 20/005 |
| 2018/0294245 A1* | 10/2018 | Kim | ........................ H01L 24/78 |

FOREIGN PATENT DOCUMENTS

| | | |
|---|---|---|
| KR | 10-2013-0098635 | 9/2013 |
| WO | WO 2013/069857 A1 | 5/2013 |

OTHER PUBLICATIONS

Korean Notice of Preliminary Rejection, dated Oct. 14, 2020, issued in corresponding Korean Patent Application No. 10-2019-0082374. English translation. Total 11 pages.

Taiwan Office Action, dated Jan. 17, 2020, issued in corresponding Taiwanese Patent Application No. 108121613, and English translation. Total 9 pages.

Chinese Office Action, dated Oct. 8, 2020, issued in corresponding Chinese Patent Application No. 201910624580.4. Total 6 pages.

\* cited by examiner

BONDING APPARATUS WITH REPLACEABLE BONDING TOOL

FIELD OF THE INVENTION

The invention relates to a bonding apparatus, and in particular, to a bonding apparatus having a replaceable bonding tool.

BACKGROUND

In a wire bonding process, electrically conductive wires are bonded between electrical bonding pads found on electronic devices, such as between a semiconductor die and a substrate onto which the die is attached. The substrate is usually a semiconductor lead frame. The electrical connection could also be made between bonding pads found on separate semiconductor dice. The bond is formed by a bonding tool which may be in the form of a capillary attached to an ultrasonic transducer for generating ultrasonic energy to the capillary tip.

In wire bonders for making so-called "ball bonds", a bond head which carries the bonding tool is designed to execute a rocking motion about a suitably located pivot. For ultrasonic bonding, an ultrasonic transducer is mounted onto the bond head, the ultrasonic transducer comprising a piezoelectric driver stack coupled to a horn, and bonding tool in the form of a capillary at an end of the horn. Bonding wire, which is typically made of gold, aluminum or copper, is fed from a spool of bonding wire through a hole in the capillary to the tip of the capillary. Bonding is done by welding the wire at the tip of the capillary to the bonding pad through the application of ultrasonic energy to the capillary tip.

The bonding tool (which is a capillary in the above example) should be replaced after a period of operation once it becomes worn. However, the dimensions of the bonding tool make the insertion of a replacement problematic.

It would be beneficial to provide an improved technique for replacing the bonding tool as compared to the prior art.

SUMMARY OF THE INVENTION

It is thus an object of this invention to seek to provide a bonding apparatus which overcomes at least some of the aforementioned problems of the prior art.

According to a first aspect of the present invention, there is provided a bonding apparatus, comprising: a bonding tool for bonding a wire to a bonding surface; a bonding tool retainer configured to releasably retain the bonding tool; a bonding tool holder configured to hold at least one bonding tool; a bonding tool manipulator configured to transfer the bonding tool between the bonding tool holder and the bonding tool retainer; and a bonding tool guide configured to guide the bonding tool to be received by the bonding tool retainer during transfer by the bonding tool manipulator.

The first aspect recognizes that a problem with replacing bonding tools is that it can be difficult to locate the bonding tool to align with the bonding tool holder, which makes fitting the bonding tool into the holder difficult. Accordingly, a bonding apparatus may be provided. The bonding apparatus may comprise a bonding tool. The bonding tool may bond a wire to a bonding surface. The apparatus may comprise a bonding tool retainer which may retain or hold the bonding tool. The apparatus may comprise a bonding tool holder which may hold or store one or more bonding tools. The apparatus may comprise a bonding tool manipulator which may transfer or move each bonding tool between the bonding tool holder and the bonding tool retainer. The bonding apparatus may comprise a bonding tool guide which may guide, channel or direct the bonding tool so that it is received by the bonding tool retainer when transferred by the bonding tool manipulator. In this way, the alignment between the bonding tool and the bonding tool retainer is improved, making it easier to insert a replacement bonding tool.

In one embodiment, the bonding tool retainer defines a retaining aperture configured to releasably retain the bonding tool and the bonding tool guide is configured to guide the bonding tool to be received by the retaining aperture during transfer by the bonding tool manipulator. Accordingly, the bonding tool retainer may provide a retaining aperture or opening which may hold and release the bonding tool when manipulated by the bonding tool manipulator. The bonding tool guide may guide or direct the bonding tool to be received within the retaining aperture when transferred by the bonding tool manipulator.

In one embodiment, the bonding tool guide is shaped to direct the bonding tool to be received by the retaining aperture during transfer by the bonding tool manipulator. Accordingly, the bonding tool guide may accommodate any misalignment of the bonding tool and realign the bonding tool with the retaining aperture.

In one embodiment, the bonding tool guide defines a receiving aperture which has a variable internal diameter to receive and guide the bonding tool during transfer by the bonding tool manipulator. Accordingly, the bonding tool guide may define a narrowing, funneling or tapered receiving aperture which accommodates any misalignment of the bonding tool.

In one embodiment, the receiving aperture is dimensioned to have an internal diameter which is larger than a diameter of an external surface of the bonding tool. Accordingly, the internal surface of the receiving aperture may be dimensioned to be larger than an external surface of the bonding tool.

In one embodiment, the receiving aperture narrows to fit the external surface of the bonding tool. Accordingly, the receiving aperture may constrict or taper.

In one embodiment, the bonding tool guide defines a guiding aperture coupled with the receiving aperture, the guiding aperture being orientated to direct the bonding tool to be received by the retaining aperture during transfer by the bonding tool manipulator. Accordingly, the guide may re-orientate the bonding tool to align the bonding tool with the retaining aperture of the bonding tool retainer.

In one embodiment, the guiding aperture is elongate and has an internal diameter which is larger than a diameter of the external surface of the bonding tool for the bonding tool to pass through the guiding aperture. Accordingly, the guiding aperture may extend through the bonding tool guide and be dimensioned to fit the external surface of the bonding tool.

In one embodiment, the apparatus comprises an alignment mechanism configured to align the bonding tool guide with the bonding tool retainer to align the bonding tool with the retaining aperture during transfer by the bonding tool manipulator. Accordingly, the apparatus may comprise an alignment mechanism which aligns the bonding tool guide with respect to the bonding tool retainer to position the bonding tool with the retaining aperture of the bonding tool retainer.

In one embodiment, the alignment mechanism comprises a position indicator located at a fixed offset position with respect to the bonding tool guide and a position indicator detector configured to derive a position of the bonding tool guide from the position indicator. Accordingly, a position of the guiding aperture of the bonding tool guide may be determined with respect to the retaining aperture of the bonding tool retainer from the position indicator, even when the guiding aperture is obscured, to enable the guiding aperture and the retaining aperture to be aligned.

In one embodiment, the position indicator detector comprises an optical detector configured to identify the position indicator.

In one embodiment, the alignment mechanism is configured to coaxially align the retaining aperture with respect to the guiding aperture of the bonding tool guide in response to the position derived from the position indicator.

In one embodiment, the apparatus comprises a misalignment sensor configured to identify a misalignment between the tool and the retaining aperture during transfer by the bonding tool manipulator. Accordingly, a sensor may detect a lack of alignment between the bonding tool and the retaining aperture.

In one embodiment, wherein the misalignment sensor comprises a bond head motor controller configured to detect an increase in motor current indicative of the misalignment between the tool and the retaining aperture during transfer by the bonding tool manipulator. Hence, the bond head motor controller can be reused to provide an indication of a misalignment as the motor current will increase should the bonding tool be moved by the bonding tool due to a misalignment with the retaining aperture.

In one embodiment, the bonding tool holder is configured to hold a plurality of the bonding tools.

In one embodiment, the bonding tool holder is configured to hold each bonding tool in a desired orientation.

In one embodiment, the bonding tool holder comprises a rotatable carousel configured with a plurality of holders positioned circumferentially to hold the plurality of the bonding tools.

In one embodiment, the bonding tool holder is configured to be positionable to present a bonding tool at a transfer position for transfer by the bonding tool manipulator to the retaining aperture, the bonding tool at the transfer position being generally coaxially aligned with the guiding aperture.

In one embodiment, the bonding tool manipulator comprises a gripper configured to releasably grip the bonding tool.

In one embodiment, the bonding tool manipulator is configured to grip the bonding tool held by the bonding tool holder and transfer the bonding tool to the bonding tool retainer by inserting the bonding tool through the bonding tool guide.

In one embodiment, the bonding tool retainer comprises a clamping mechanism configured to configured to releasably retain the bonding tool.

In one embodiment, the bonding tool retainer comprises a clamping gripper configured to vary a size of the retaining aperture and a clamping actuator configured to actuate the clamping gripper. Accordingly, the clamping gripper may open and close the retaining aperture.

In one embodiment, the clamping gripper comprises an operating structure configured to engage with a complementary operating structure of the clamping actuator by receiving one of the operating structure and the complementary operating structure within the other of the operating structure and the complementary operating structure.

According to a second aspect of the present invention, there is provided a method, comprising the steps of: providing a bonding tool holder configured to hold at least one bonding tool for bonding a wire to a bonding surface; positioning a bonding tool retainer configured to releasably retain the bonding tool; positioning a bonding tool guide configured to guide the bonding tool during transfer of the bonding tool between the bonding tool holder and the bonding tool retainer; and transferring the bonding tool between the bonding tool holder and the bonding tool retainer via the bonding tool guide with a bonding tool manipulator.

In one embodiment, the method comprises defining a retaining aperture in the bonding tool retainer to releasably retain the bonding tool and configuring the bonding tool guide to guide the bonding tool to be received by the retaining aperture during transfer by the bonding tool manipulator.

In one embodiment, the method comprises shaping the bonding tool guide to direct the bonding tool to be received by the retaining aperture during transfer by the bonding tool manipulator.

In one embodiment, the method comprises defining a receiving aperture in the bonding tool guide with a variable internal diameter to receive and guide the bonding tool during transfer by the bonding tool manipulator.

In one embodiment, the method comprises dimensioning the receiving aperture to have an internal diameter which is larger than a diameter of an external surface of the bonding tool.

In one embodiment, the receiving aperture narrows to fit the external surface of the bonding tool.

In one embodiment, the method comprises defining a guiding aperture in the bonding tool guide which is coupled with the receiving aperture and orientating the guiding aperture to direct the bonding tool to be received by the retaining aperture during transfer by the bonding tool manipulator.

In one embodiment, the guiding aperture is elongate and has an internal diameter which is larger than a diameter of the external surface of the bonding tool for the bonding tool to pass through the guiding aperture.

In one embodiment, the method comprises aligning the bonding tool guide with the bonding tool retainer with an alignment mechanism to align the bonding tool with the retaining aperture during transfer by the bonding tool manipulator.

In one embodiment, the method comprises providing a position indicator as the alignment mechanism, locating the position indicator at a fixed offset position with respect to the bonding tool guide, providing a position indicator detector and deriving a position of the bonding tool guide from the position indicator.

In one embodiment, the method comprises providing an optical detector to identify the position indicator as the position indicator detector.

In one embodiment, the method comprises coaxially aligning the retaining aperture with respect to the guiding aperture of the bonding tool guide in response to the position derived from the position indicator.

In one embodiment, the method comprises identifying a misalignment between the tool and the retaining aperture during transfer by the bonding tool manipulator with a misalignment sensor.

In one embodiment, the method comprises providing a bond head motor controller as the misalignment sensor and detecting an increase in motor current indicative of the misalignment between the tool and the retaining aperture during transfer by the bonding tool manipulator.

In one embodiment, the method comprises configuring the bonding tool holder to hold a plurality of the bonding tools.

In one embodiment, the method comprises configuring the bonding tool holder to hold each bonding tool in a desired orientation.

In one embodiment, the method comprises providing a rotatable carousel as the bonding tool holder and configuring the rotatable carousel with a plurality of holders positioned circumferentially to hold the plurality of the bonding tools.

In one embodiment, the method comprises configuring the bonding tool holder to be positionable to present a bonding tool at a transfer position for transfer by the bonding tool manipulator to the retaining aperture, the bonding tool at the transfer position being generally coaxially aligned with the guiding aperture.

In one embodiment, the method comprises providing a gripper configured to releasably grip the bonding tool as the bonding tool manipulator.

In one embodiment, the method comprises configuring the bonding tool manipulator to grip the bonding tool held by the bonding tool holder and transferring the bonding tool to the bonding tool retainer by inserting the bonding tool through the bonding tool guide.

In one embodiment, the method comprises configuring a clamping mechanism of the bonding tool retainer to releasably retain the bonding tool.

In one embodiment, the method comprises varying a size of the retaining aperture with a clamping gripper and a clamping actuator.

In one embodiment, the method comprises engaging an operating structure of the clamping gripper with a complementary operating structure of the clamping actuator.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments of the invention in any more detail, an overview will first be provided. The embodiments provide a bonding apparatus which allows for automatic changing of a bonding tool. Aligning the bonding tool to an opening in a bonding tool retainer can be difficult to achieve. A bonding tool guide is placed between the bonding tool retainer and the bonding tool to be inserted into the bonding tool retainer. The bonding tool guide has an opening which is adapted to accommodate any misalignment between the bonding tool and the bonding tool retainer. The bonding tool guide typically has a portion which initially accommodates any misalignment between it and the bonding tool, and has a redirecting portion which is orientated to align the bonding tool with a receiving aperture of the bonding tool retainer.

Typically, in order to align the bonding tool retainer with the bonding tool guide, the bonding tool guide has a spatial locator which enables a location of the bonding tool guide to be located in space. The bonding tool retainer and the bonding tool guide can then be positioned with respect to each other using the position indicator in order to align the apertures of both, so that as the bonding tool is passed through the bonding tool guide, it is received within the opening in the bonding tool retainer.

Wire Bonding Tool Change Apparatus

Figure 1:
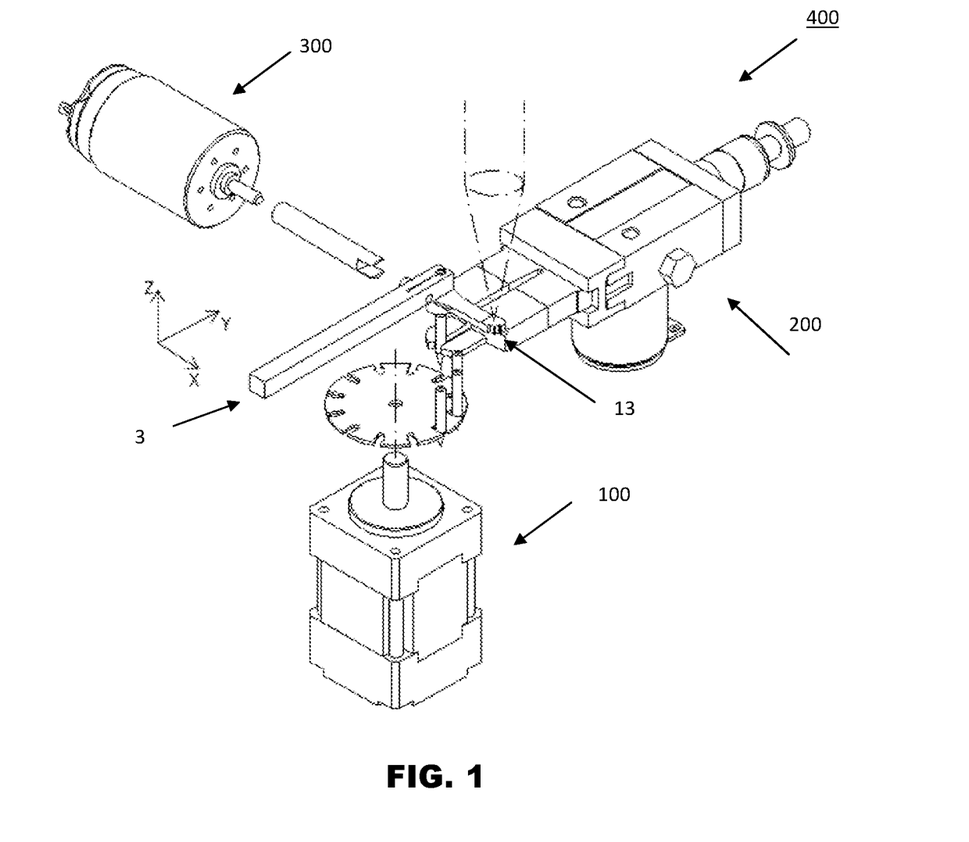
FIG. 1 illustrates a wire bonding tool change apparatus for a wire bonding apparatus according to one embodiment.

FIG. 1 illustrates a wire bonding tool change apparatus 400 for a wire bonding apparatus according to one embodiment. The wire bonding tool change apparatus 400 provides for automatic removal and replacement of wire bonding tools 1. The wire bonding tool change apparatus 400 comprises a wire bonding ultrasonic transducer 3 of the wire bonding apparatus (the other components of the wire bonding apparatus have been omitted to improve clarity) which holds a wire bonding tool 1 (such as a bonding wedge or a capillary). A wire bonding tool feeding apparatus 100 holds replacement wire bonding tools 1 for insertion into the wire bonding ultrasonic transducer 3. A wire bonding tool insertion apparatus 200 operates to remove (if required) a worn bonding tool 1 from the wire bonding ultrasonic transducer 3 and to retrieve a replacement bonding tool 1 from the wire bonding tool feeding apparatus 100 for insertion into the wire bonding ultrasonic transducer 3. A wire bonding tool clamp actuator 300 operates a clamping mechanism on the wire bonding ultrasonic transducer 3 to release or hold the bonding tool 1. A wire bonding tool alignment device 13 is coaxially aligned with the wire bonding tool feeding apparatus 100 which holds the replacement bonding tools 1. The wire bonding ultrasonic transducer 3 is moveable by actuators (not shown) and its position is adjusted based on feedback provided by a vision system (not shown) which images the relative position of the wire bonding ultrasonic transducer 3 with respect to the wire bonding tool alignment device 13. Once aligned, a replacement wire bonding tool 1 is retrieved from the wire bonding tool feeding apparatus 100 by the wire bonding tool insertion apparatus 200 and fed through the wire bonding tool alignment device 13 to be received by the wire bonding ultrasonic transducer 3, the wire bonding tool clamp actuator 300 then clamps the wire bonding ultrasonic transducer 3 in place.

Wire Bonding Ultrasonic Transducer

Figure 2:
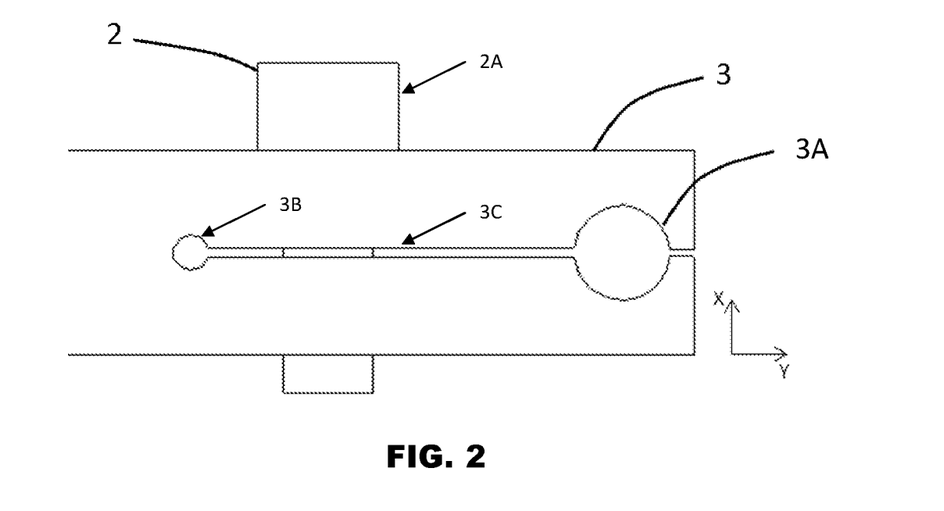
FIG. 2 is a top view showing an end arrangement of a wire bonding ultrasonic transducer in more detail.

FIG. 2 is a top view showing the end arrangement of the wire bonding ultrasonic transducer 3 in more detail. The wire bonding ultrasonic transducer 3 defines an elongate slot 3C extending from an open, distil end and along a length of an end portion of the wire bonding ultrasonic transducer 3, terminating in a circular aperture 3B. Positioned along the length of the slot 3C, proximate the distil end is a receiving aperture 3A which is shaped to receive the bonding tool 1. A screw 2 having an outer surface 2A extends in an X axis and engages with screw threads (not shown) within wire bonding ultrasonic transducer 3. In operation, rotation of the screw 2 causes the two sides of the aperture 3A to displace generally in the X axis either towards or away from each other, pivoting about the aperture 3B to release or grip any wire bonding tool 1 held therewithin.

Wire Bonding Tool Clamp Actuator

Figure 3:
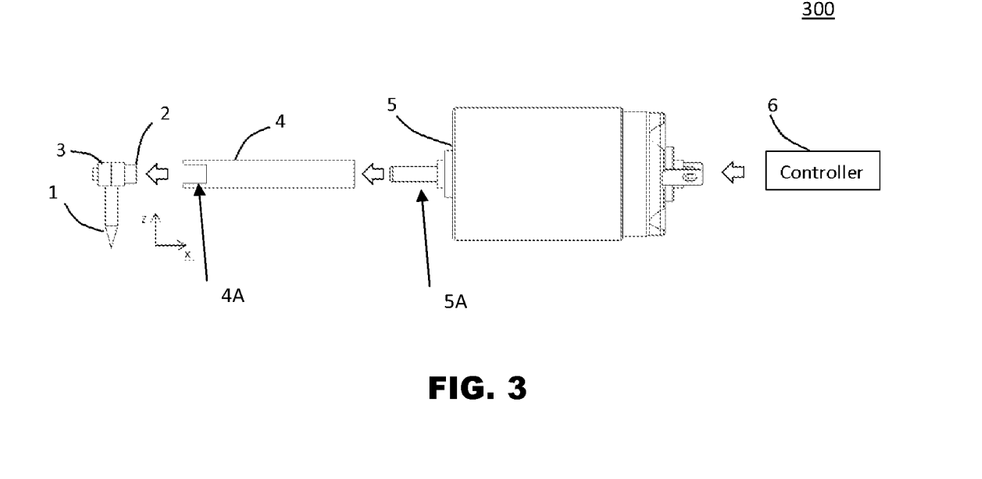
FIG. 3 illustrates a wire bonding tool clamp actuator in more detail.

FIG. 3 illustrates the wire bonding tool clamp actuator 300 in more detail. A clamp manipulator 4 defines an opening 4A which is shaped to engage with the outer surface 2A of the screw 2. The opening 4A is larger than that of the outer surface 2A of the screw 2 and so the alignment between the opening 4A and the screw 2 does not require high accuracy. The clamp manipulator 4 is received on a spindle 5A of a motor actuator 5. The motor actuator 5 is controlled by a controller 6 which operates to supply power to the motor actuator 5. In operation, when it is required to clamp or unclamp a wire bonding tool 1, the ultrasonic transducer 3 is located to generally align with the wire bonding tool clamp actuator 300. The wire bonding tool clamp actuator 300 moves along the X axis to engage the outer surface 2A of the screw 2 with the opening 4A. The controller 6 then provides the appropriate power to the motor actuator 5 to either loosen or tighten the screw 2 to open or close the receiving aperture 3A. Once the operation has been performed, then the wire bonding tool clamp actuator 300 can be retracted along the X axis, if required. Hence, the wire bonding tool 1 (such as a bonding wedge or a capillary), is mechanically clamped to the ultrasonic transducer 3. The wire bonding tool clamp actuator 300 is designed to open or close the mechanical clamper by applying or removing a mechanical force.

Wire Bonding Tool Feeding Apparatus

Figure 4A:
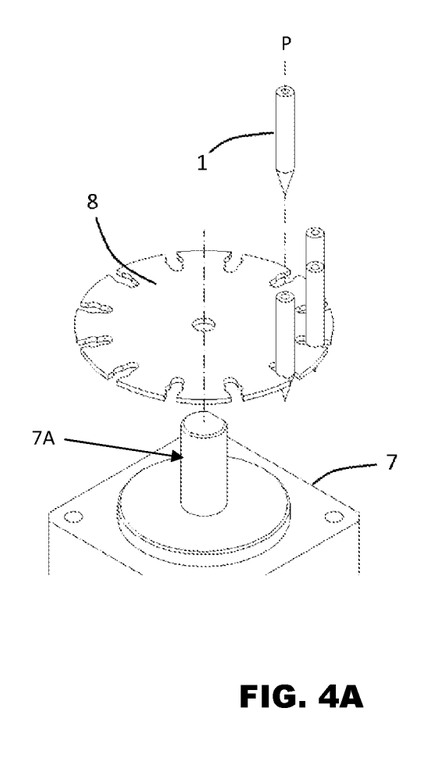
FIGS. 4A and 4B illustrate a wire bonding tool feeding apparatus in more detail.
Figure 4B:
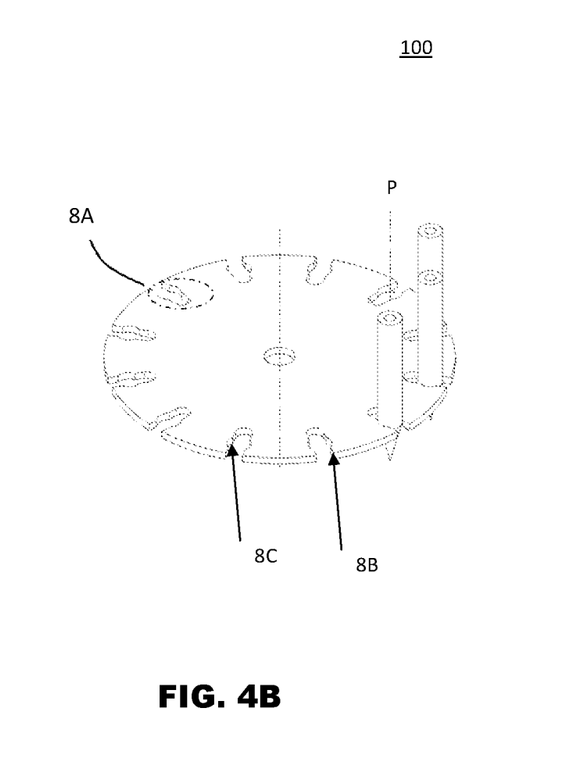

FIGS. 4A and 4B illustrates the wire bonding tool feeding apparatus 100 in more detail. The wire bonding tool feeding apparatus 100 comprises a magazine 8 (carousel) which defines slots 8A shaped to receive a supply of wire bonding tools 1. The slots 8A extend radially and are located circumferentially around the magazine 8. The slots 8A are defined by a generally uniform opening 8B which is generally smaller than the external dimension of the bonding tool 1, with an enlarged opening 8C dimensioned to provide a friction fit with the bonding tool 1. The magazine 8 is received on a spindle 7A of a motor 7. In operation, the magazine 8 receives a plurality of replacement wire bonding tools 1 which are fed when required to replace worn wire bonding tools 1 in the wire bonding ultrasonic transducer 3. When required, the motor 7 operates under the control of the controller 6 to rotate the magazine 8 to present a new wire bonding tool 1 at a dispensing position P for insertion into the wire bonding ultrasonic transducer 3.

Wire Bonding Tool Insertion Apparatus

Figure 5A:
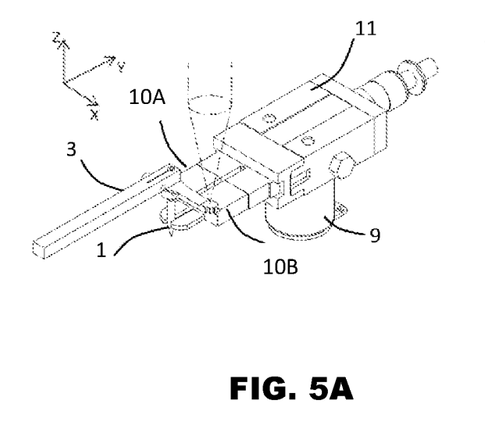
FIGS. 5A and 5B illustrate a wire bonding tool insertion apparatus in more detail.
Figure 5B:
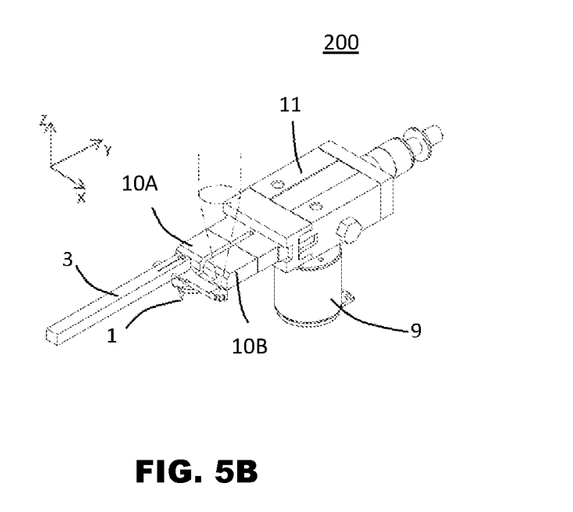

FIGS. 5A and 5B illustrate the wire bonding tool insertion apparatus 200 in more detail. The wire bonding tool insertion apparatus 200 comprises an actuator 11 which operates to open and close grippers 10A, 10B. The grippers 10A, 10B move relative to each other along the X axis. A motion system 9 operates to move the grippers 10A, 10B along the Z axis. In operation, the grippers 10A, 10B are moved to an open position under the control of the actuator 11. The motion system lowers the grippers around a new wire bonding tool 1 presented by the wire bonding tool feeding apparatus 100 at the dispensing position P. The actuator 11 closes the grippers 10A, 10B to grip on the sides of the new bonding tool 1. Once gripped, the motion system 9 elevates the grippers 10A, 10B along the Z axis of the dispensing position P to transfer the new wire bonding tool 1 to be received by the ultrasonic transducer 3, as will be explained in more detail below.

Wire Bonding Tool Alignment Device

Figure 6A:
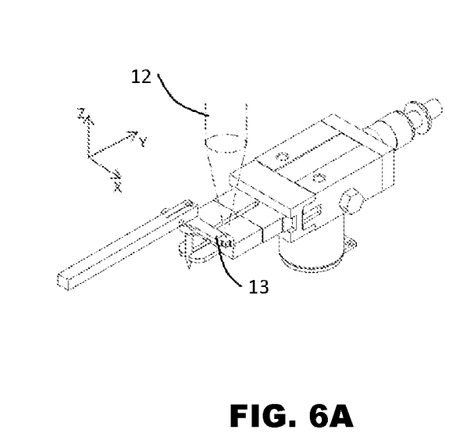
FIGS. 6A and 6B illustrates a wire bonding tool alignment device in more detail.
Figure 6B:
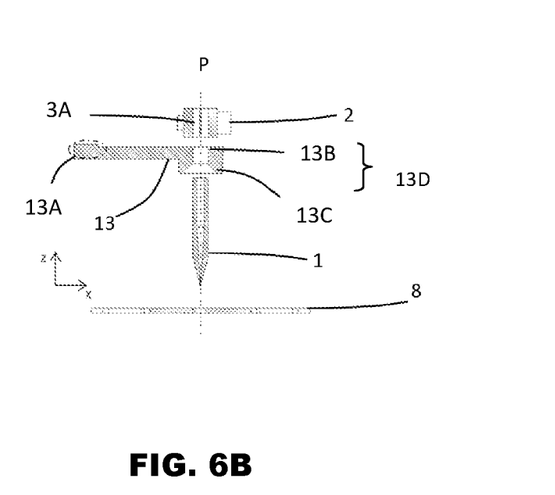

FIGS. 6A and 6B illustrate the wire bonding tool alignment device 13 in more detail. The wire bonding tool alignment device 13 has a guiding aperture 13D. As can be seen, the wire bonding tool alignment device 13 is located so that the guiding aperture 13D is aligned with respect to the dispensing position P. It will be appreciated that a variety of different structures may be used to fix the position of the guide 13 with respect to the dispensing position P of the magazine 8 and that structure has been omitted to improve clarity.

As mentioned above, the wire bonding tool alignment device 13 has a position identifier 13A, from which the location of the guiding aperture 13D (and thus the dispensing position P) can be derived. In particular, the position identifier 13A is located at a fixed position with respect to the guiding aperture 13D. A vision system 12 images the position identifier 13A. The vision system 12 may be provided as part of the wire bonding ultrasonic transducer 3 in which case the position of the aperture 3A with respect to the guiding aperture 13D can be derived (even when obscured by the wire bonding ultrasonic transducer 3) by simply imaging the location of the position identifier 13A. The vision system 12 may alternatively be provided separately in which case the position of the aperture 3A with respect to the guiding aperture 13D can be derived (even when obscured by the wire bonding ultrasonic transducer 3) by imaging the location of the position identifier 13A which has a predetermined offset relative to the aperture 3A. The position of the aperture 3A is adjusted typically by movement of the wire bonding ultrasonic transducer 3 to align the aperture 3A with the guiding aperture 13D (and thus also aligning the aperture 3A with the dispensing position P).

The guiding aperture 13D is formed from two components. The first is a narrowing aperture 13C. The narrowing aperture 13C is located proximate the wire bonding tool feeding apparatus 100. The narrowing aperture 13C is conical in shape and has a receiving opening which is dimensioned to be somewhat larger than the external dimension of the wire bonding tool 1. The narrowing aperture 13C narrows to provide a close fit around the external dimension of the bonding tool 1. The second is a directing aperture 13B which couples with the narrowing aperture 13C and is positioned distal from the wire bonding tool feeding apparatus 100. It will be appreciated that other structures could be used to align the wire bonding tool 1.

In operation, the replacement wire bonding tool 1 is elevated along the Z axis by the wire bonding tool insertion apparatus 200 and is received initially in the narrowing aperture 13C. Should the replacement wire bonding tool 1 be misaligned, then the narrowing aperture 13C guides the replacement wire bonding tool 1 towards the guiding aperture 13B. Once within the guiding aperture 13B, then the replacement wire bonding tool 1 is correctly orientated to be aligned and orientated with the aperture 3A. Continued movement of the replacement wire bonding tool 1 in the along the Z axis locates the bonding tool within the aperture 3A. Once fully located, the controller 6 powers the motor 5 to operate the clamp manipulator 4 on the screw 2 to close the receiving aperture 3A and grip the replacement wire bonding tool 1 in place in the wire bonding ultrasonic transducer 3.

One embodiment of the invention provides a combination of sub-systems for automatically changing the bonding tool on a wire bonding machine. It is particularly, though not exclusively, applicable to changing of a bonding capillary used in wire bonding systems. The bonding tool is clamped by a clamper, normally an ultrasonic transducer, to the clamping position. The clamper, which can move freely in x-y-z axes to a designated position to perform an automatic bonding tool change, is an integrated part of a wire bonding machine. The opening or closing of the clamper is controlled by locking or releasing a screw. During the locking and release process, the clamper on the wire bonding machine moves to a predetermined position where the screw is aligned with a release/lock tool. A matching feature on the release/lock tool is larger than that of the screw, thus the screw-tool alignment does not require very high accuracy. An actuator receives a command from the controller and drives the release/lock tool. The release/lock tool transfers the torsion of the motor to the screw. Thus, the opening and closing of the clamper is controlled by the system. The torque value applied to the screw by the actuator is directly proportional to the current supplied to the actuator. The mechanical structure of the clamp is able to deform during opening or closing of the bonding tool clamp. A stop is provided to keep the deformation within a safety range. It is possible to insert or remove a tool to forcibly open or close the clamping structure. A new bonding tool is taken from a feeding magazine when it is clamped by a gripper. An actuator which controls the opening and closing of the gripper is connected to a motion system. The motion system generates a movement and puts the new bonding tool into the clamper. After insertion, the release/lock tool is then deployed to close the clamper. The clamper then moves upwards in the Z-axis with the new bonding tool. This approach ensures that the bonding tool is inserted correctly into the capillary hole. During the insertion process, the bondhead motor coil current will be monitored to detect and protect against any jam, which is detectable from an unexpected increase in motor coil current.

Although the present invention has been described in considerable detail with reference to certain embodiments, other embodiments are possible.

Therefore, the spirit and scope of the appended claims should not be limited to the description of the embodiments contained herein.

The invention claimed is:

1. A bonding apparatus, comprising:
   a bonding tool for bonding a wire to a bonding surface;
   a bonding tool retainer configured to releasably retain the bonding tool;
   a bonding tool holder configured to hold at least one bonding tool;
   a bonding tool manipulator configured to transfer said bonding tool between said bonding tool holder and said bonding tool retainer; and
   a bonding tool guide configured to guide said bonding tool to be received by said bonding tool retainer during transfer by said bonding tool manipulator,
   wherein said bonding tool manipulator is further configured to grip said bonding tool held by said bonding tool holder and transfer said bonding tool to said bonding tool retainer by inserting said bonding tool through said bonding tool guide.

2. The bonding apparatus of claim 1, wherein said bonding tool retainer defines a retaining aperture configured to releasably retain said bonding tool and said bonding tool guide is configured to guide said bonding tool to be received by said retaining aperture during transfer by said bonding tool manipulator.

3. The bonding apparatus of claim 2, wherein said bonding tool guide is shaped to direct said bonding tool to be received by said retaining aperture during transfer by said bonding tool manipulator.

4. The bonding apparatus of claim 1, wherein said bonding tool guide defines a receiving aperture which has a variable internal diameter to receive and guide said bonding tool during transfer by said bonding tool manipulator.

5. The bonding apparatus of claim 4, wherein said receiving aperture is dimensioned to have an internal diameter which is larger than a diameter of an external surface of said bonding tool.

6. The bonding apparatus of claim 5, wherein said receiving aperture narrows to fit said external surface of said bonding tool.

7. The bonding apparatus of claim 4, wherein said bonding tool guide defines a guiding aperture coupled with said receiving aperture, said guiding aperture being orientated to direct said bonding tool to be received by a retaining aperture of said bonding tool retainer configured to releasably retain said bonding tool during transfer by said bonding tool manipulator.

8. The bonding apparatus of claim 7, wherein said guiding aperture is elongate and has an internal diameter which is larger than a diameter of said external surface of said bonding tool for the bonding tool to pass through the guiding aperture.

9. The bonding apparatus of claim 2, comprising an alignment mechanism configured to align said bonding tool guide with said bonding tool retainer to align said bonding tool with said retaining aperture during transfer by said bonding tool manipulator.

10. The bonding apparatus of claim 9, wherein said alignment mechanism comprises a position indicator located at a fixed offset position with respect to said bonding tool guide and a position indicator detector configured to derive a position of said bonding tool guide from said position indicator.

11. The bonding apparatus of claim 10, wherein said position indicator detector comprises an optical detector configured to identify said position indicator.

12. The bonding apparatus of claim 10, wherein said alignment mechanism is configured to coaxially align said retaining aperture with respect to said guiding aperture of said bonding tool guide in response to said position derived from said position indicator.

13. The bonding apparatus of claim 2, comprising a misalignment sensor configured to identify a misalignment between said tool and said retaining aperture during transfer by said bonding tool manipulator.

14. The bonding apparatus of claim 13, wherein said misalignment sensor comprises a bond head motor controller configured to detect an increase in motor current indicative of said misalignment between said tool and said retaining aperture during transfer by said bonding tool manipulator.

15. The bonding apparatus of claim 2, wherein said bonding tool holder is configured to be positionable to present a bonding tool at a transfer position for transfer by said bonding tool manipulator to said retaining aperture, said bonding tool at said transfer position being generally coaxially aligned with said guiding aperture.

16. The bonding apparatus of claim 1, wherein said bonding tool manipulator comprises a gripper configured to releasably grip said bonding tool.

17. The bonding apparatus of claim 1, wherein said bonding tool retainer comprises a clamping gripper configured to vary a size of said retaining aperture and a clamping actuator configured to actuate said clamping gripper.

18. The bonding apparatus of claim 17, wherein said clamping gripper comprises an operating structure configured to engage with a complementary operating structure of said clamping actuator by receiving one of said operating structure and said complementary operating structure within the other of said operating structure and said complementary operating structure.

\* \* \* \* \*